(12) United States Patent
Muramatsu et al.

(10) Patent No.: US 6,455,909 B1
(45) Date of Patent: Sep. 24, 2002

(54) IMAGE SENSOR

(75) Inventors: Yoshinori Muramatsu; Tsuyoshi Nagata, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/726,591

(22) Filed: Dec. 1, 2000

(30) Foreign Application Priority Data

Dec. 3, 1999 (JP) .......................................... 11-344927

(51) Int. Cl.[7] .............................................. H01L 31/00
(52) U.S. Cl. ........................ 257/444; 257/443; 257/459
(58) Field of Search ................................. 257/290–292, 257/443, 444, 459

(56) References Cited

U.S. PATENT DOCUMENTS

| | | | |
|---|---|---|---|
| 5,115,293 A | * 5/1992 | Murayama et al. | 257/292 |
| 5,161,237 A | * 11/1992 | Hartman et al. | 359/54 |
| 5,452,004 A | * 9/1995 | Roberts | 348/301 |
| 5,614,744 A | * 3/1997 | Merrill | 257/291 |
| 5,886,353 A | * 3/1999 | Spivey et al. | 250/208.1 |
| 5,942,774 A | * 8/1999 | Isogai et al. | 257/292 |
| 6,072,206 A | 6/2000 | Yamashita et al. | 257/292 |
| 6,297,862 B1 | * 10/2001 | Murade | 349/110 |

FOREIGN PATENT DOCUMENTS

JP          11-274456          8/1999          ......... H01L/27/146

OTHER PUBLICATIONS

Eric R. Fossum, "Active Pixel Sensors: Are CCD's Dinosaurs?", SPIE, vol. 1900, pp. 2–14, (1993), Jet Propulsion Laboratory, California Institute of Technology, 4800 Oak Grove Drive, Pasadena, California 91109.

* cited by examiner

Primary Examiner—Allan R. Wilson
(74) Attorney, Agent, or Firm—Foley & Lardner

(57) ABSTRACT

A MOS type image sensor including a plurality of pixel array sections each including, as interconnects traversing the pixel array section, a signal reset line and a row selection line stacked with each other and sandwiching a dielectric film. In the image sensor, the areas of the signal reset line and the row selection line occupied in the pixel section can be reduced to consequently increase the area of the light-receiving section occupied in the pixel section, thereby increasing the sensitivity to light.

12 Claims, 4 Drawing Sheets

IMAGE SENSOR

BACKGROUND OF THE INVENTION (a) Field of the Invention

The present invention relates to a MOS type image sensor suitably used for a camera and a reading device.

(b) Description of the Related Art

The MOS (metal oxide Semiconductor) type image sensor can be fabricated in a standardized MOS process, different from a CCD image sensor requiring dedicated processes The MOS type image sensor attracting the public attention in these days has advantages that lower electric power consumption can be achieved by an operation with a lower voltage and a single electric power source, and peripheral logic elements and macroelements can be mounted on a single chip.

In FIG. 1, an exemplified layout of a pixel section of the conventional MOS type image sensor developed by E. R. Fossum et al. (SPIE, 1900, pp.2–14, 1993) is shown. In this layout, a MOS type image sensor includes a pixel array including a plurality of pixel areas, each of the pixel areas generating a signal charge by photoelectric conversion, a row selection line disposed for each row of the pixel areas for selecting the row of the pixel areas, a signal reset line disposed for each row of the pixel areas for resetting the row of the pixel areas to a reset level, and a signal output line disposed for each column of the pixel areas for outputting the signal charge and the reset level from the corresponding column of the pixel areas selected by the row selection line. The signal reset line "R" and the row selection line "S" made of the same interconnect material has substantially same width and thickness.

In each of the pixel sections, the signal charge generated by the photoelectric conversion in the pixel section is taken out by a transmission line "TX"by way of a transfer FET to an output line VOUT. The signal charge is taken out by raising the potential of the row selection line "S" to a high level to raise the gate potential of the transfer FET. The reset line "R" is activated when the row selection line "S" is maintained at the high level. After the resetting, a reference signal is taken out to the output line VOUT The irregularities among the pixel sections are cancelled by using the difference between the signal level by the signal charge and the reset level by the resetting.

In FIG. 2 showing the read timing of the conventional image sensor, the row selection line "S" is, at first, activated to a high level to take out a signal charge in a light-receiving section "PG" for reading. When the row selection line "S" is maintained at the high level, the signal reset line "R" is activated to a high level and the reset level is taken out for reading after the reading of the signal charge.

However, the conventional technique has the following problems. In the arrangement between the signal reset line "R" and the row selection line "S" in the conventional image sensor, the area occupied in the pixel lo section by the pair of the lines "R" and "S" increases to consequently reduce the area occupied in the pixel section by the light-receiving section "PG", thereby reducing the sensitivity to light.

As shown in FIG. 2, further in the conventional image sensor in which the signal reset line "R" and the row selection line "S" having substantially same width and thickness are adjacent to each other, each of the lines may generate coupling noises 14 due to the capacitance between the interconnects at the time of the rise and the fall of the signal. Especially, when the signal reset is malfunctioned at the time of activating the row selection line "S", the signal level subjected to the photoelectric conversion at the light-receiving section "PG" may be destroyed.

SUMMARY OF THE INVENTION

In view of the foregoing, an object of the present invention is to provide an image sensor in which a larger area for a light-receiving section can be secured by reducing an area occupied by lines in a row direction, and a signal subjected to photoelectric conversion at the light-receiving section is hardly destroyed.

The present invention provides a MOS type image sensor including a pixel array including a plurality of pixel areas, each of the pixel areas generating a signal charge by photoelectric conversion, a row selection line disposed for each row of the pixel areas for selecting the row of the pixel areas, a signal reset line disposed for each row of the pixel areas for resetting the row of the pixel areas to a reset level, and a signal output line disposed for each column of the pixel areas for outputting the signal charge and the reset level from the corresponding column of the pixel areas selected by the row selection line, wherein the row selection line and the signal reset line are stacked sandwiching therebetween a dielectric film.

In accordance with the present invention, the areas of the signal reset line and the row selection line occupied in the pixel section can be reduced to consequently increase the area of the light-receiving section occupied in the pixel section, thereby increasing the sensitivity to light. Further, when the resistance of the row selection line is higher than that of the signal reset line, coupling noises are mainly generated in the row selection side and seldom generated in the signal reset line side at the time of the rise and the fall of the signal. Accordingly, the signal level obtained by photoelectric conversion in the pixel section is not destroyed.

The above and other objects, features and advantages of the present invention will be more apparent from the following description.

PREFERRED EMBODIMENTS OF THE INVENTION

Now, the present invention is more specifically described with reference to accompanying drawings.

Figure 1:
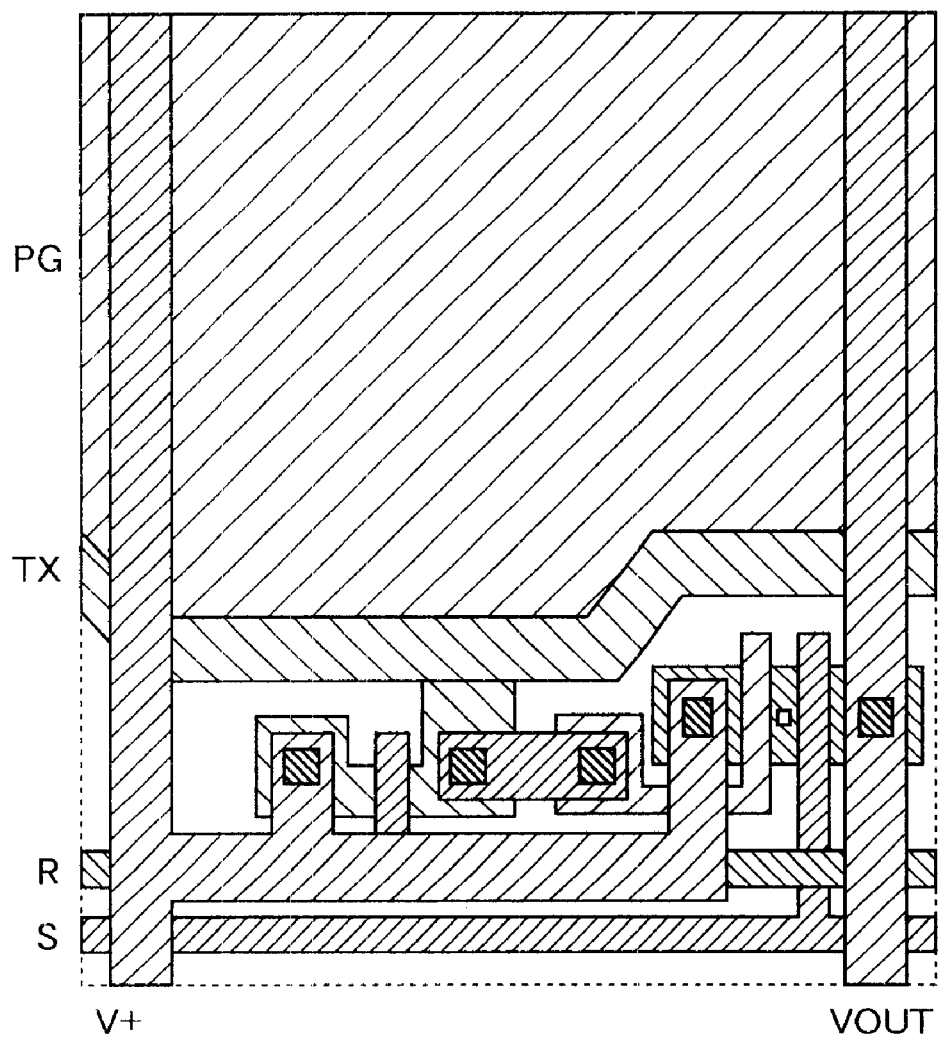
FIG. 1 is a schematic view showing a conventional is image sensor.
Figure 2:
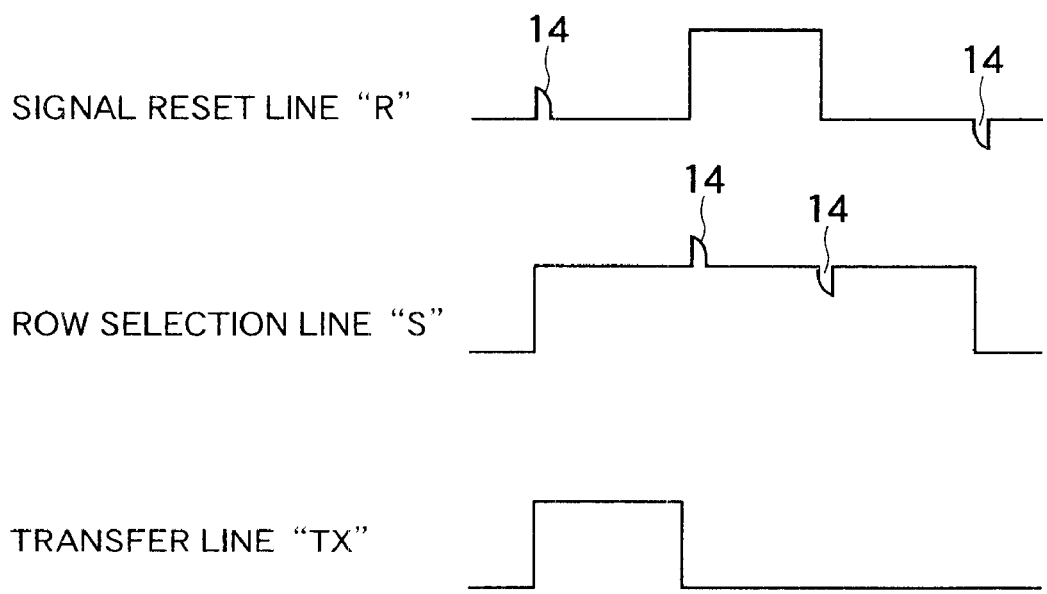
FIG. 2 is a diagram showing waveforms obtained in the conventional image sensor.
Figure 3:
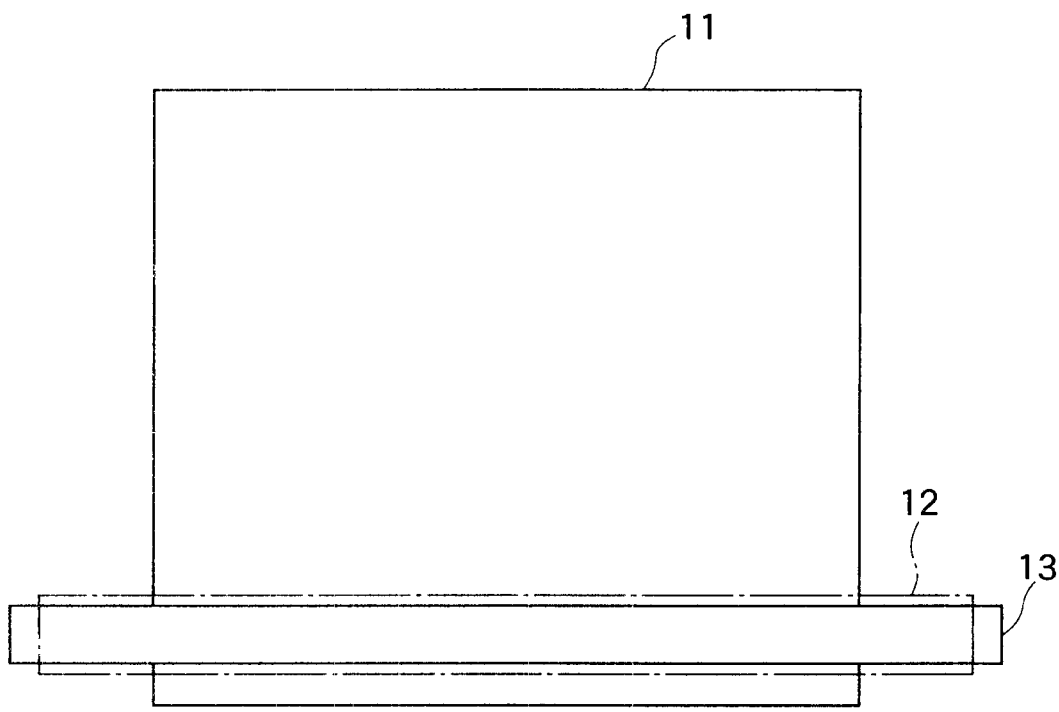
FIG. 3 is a schematic view showing an image sensor in accordance with a first embodiment of the present invention.

In FIG. 3 showing an image sensor in accordance with a first embodiment of the present invention, a signal reset line 12 and a row selection line 13 traversing a pixel section 11 are stacked with each other and sandwiching a dielectric film. The signal reset line 12, the row selection line 13 and the dielectric film are formed in accordance with the conventional thin-film-deposition technique and the microprocessing technique, and the width of the row lo selection line 13 is narrower than that of the signal reset line 12.

The resistance of the row selection line 13 made of, for example, a polycrystalline silicon-based material is higher than that of the signal reset line 12 made of, for example, an aluminum-based material. The resistance per unit area of the polycrystalline silicon-based material is higher than that of the aluminum-based material.

Although not shown in the drawings, a power source line, a reading line, the light-receiving section for photoelectric conversion including a photodiode and a MOS switching transistor, an amplifier, a reset switch and a selection switch are included in the pixel section 11 formed in accordance with the conventional thin-film-deposition technique and the micro-processing technique, other than the signal reset line 12 and the row selection line 13.

Figure 4:
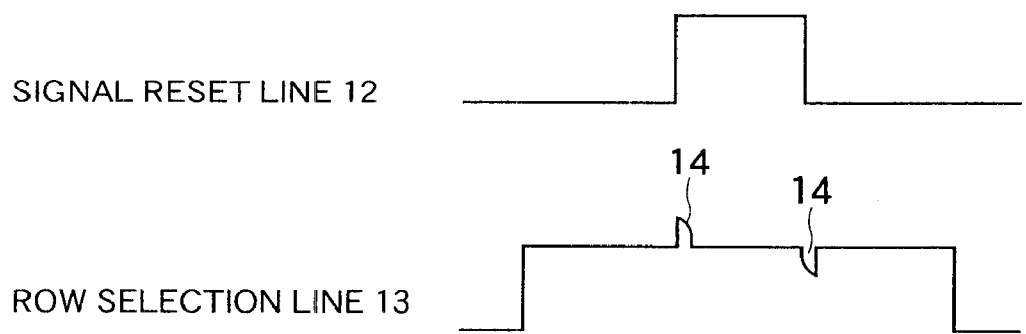
FIG. 4 is a diagram showing waveforms obtained in the image sensor of the first embodiment.

In FIG. 4 showing the read timing of the signal charge at the light-receiving section of the image sensor of the first embodiment, the row selection line 13 is, at first, activated to a high level to take out a signal charge in the light-receiving section for reading similarly to the conventional technique. When the row selection line 13 is maintained in the high level, the signal reset line 12 is once activated to a high level and the reset level is taken out for reading after the reading of the signal charge. At this stage, since the resistance of the signal reset line 12 is lower than the row selection line 13, coupling noises 14 are generated at the signal level of the row selection line 13 at the time of the rise and the fall of the signal level of the signal reset line 12. On the other hand, since the resistance of the row selection line 13 is higher than that of the signal reset line 12, the signal level of the signal reset line 12 is not affected by the coupling noises 14 at the time of the rise and the fall of the signal level of the row selection line 13. Accordingly, the noise conventionally generated is not generated as shown in FIG. 4

In the image sensor of the first embodiment having the stacked signal reset line 12 and row selection line 13, the area of the row direction selection lines occupied in the pixel section 11 can be reduced to consequently increase the area of the light-receiving section occupied in the pixel section, thereby increasing the sensitivity to light.

The higher resistance of the row selection line 13 than that of the signal reset line 12 generates no coupling noise affecting the signal reset line 12 at the time of the rise and the fall of the row selection line 13 and does not destroy the signal level obtained by the photoelectric conversion in the pixel section. Although the row selection line 13 is affected by the coupling noise at the time of the rise and the fall of the signal reset line 12, the affection does not hinder the reading operation.

Although the signal reset line 12 and the row selection line 13 are activated to the high level in the first embodiment, these lines may be activated to a low level depending on kinds of switches for the row selection and the signal reset.

In another embodiment having the basic configuration similar to that of the first embodiment, materials such as polycrystalline silicon and tungsten silicide used as a gate electrode material of a transistor formed in the image sensor may be used as those for the signal reset line 12 and the row selection line 13. In the embodiment, in order to increase the resistance of the row selection line 13 higher than that of the signal reset line 12, the sectional area of the row selection line 13 is adjusted smaller than that of the signal reset line 12 to increase the resistance of the row selection line 13 in place of changing the interconnect materials.

In this embodiment, since the two lines 13 and 12 can also function as a gate of a transistor, no contact region for connecting the interconnect and the gate of the transistor is required, thereby reducing the layout area of the interconnect occupied in the pixel section 11. Further, the surface areas are adjusted by thinning the row selection line 13 than the signal reset line 12 to reduce the bonding capacitance with the signal reset line 12, thereby reducing the influence of the coupling noise. is Moreover, the higher resistance of the row selection line 13 can be realized by making the thickness thereof thinner than that of the signal reset line 12.

Since the above embodiments are described only for examples, the present invention is not limited to the above embodiments and various modifications or alternations can be easily made therefrom by those skilled in the art without departing from the scope of the present invention.

What is claimed is:

1. A MOS type image sensor comprising a pixel array including a plurality of pixel sections, each of the pixel sections generating a signal charge by photoelectric conversion, a row selection line disposed for each row of the pixel sections for selecting the row of the pixel sections, a signal reset line disposed for each row of the pixel sections for resetting the row of the pixel sections to a reset level, and a signal output line disposed for each column of the pixel sections for outputting the signal charge and the reset level from the corresponding column of the pixel sections selected by the row selection line, wherein the row selection line and the signal reset line are stacked sandwiching therebetween a dielectric film.

2. The MOS type image sensor as defined in claim 1, wherein a resistance per unit area of the row selection line is higher than that of the signal reset line.

3. The MOS type image sensor as defined in claim 2, wherein the row selection line is made of a first conductive material containing silicon and the signal reset line is made of a second conductive material containing aluminum.

4. The MOS type image sensor as defined in claim 1, wherein a sectional area of the row selection line is smaller than that of the signal reset line made of a conductive material substantially the same as that of the row selection line.

5. The MOS type image sensor as defined in claim 4, wherein the width of the row selection line is smaller than that of the signal reset line.

6. The MOS type image sensor as defined in claim 4, wherein the conductive material is substantially the same as that of a gate electrode of a transistor included in the image sensor.

7. A MOS type image sensor comprising a pixel array including a plurality of pixel sections, each of the pixel sections generating a signal charge by photoelectric conversion, a row selection line disposed for each row of the pixel sections for selecting the row of the pixel sections, a signal reset line disposed for each row of the pixel sections for resetting the row of the pixel sections to a reset level, and a signal output line disposed for each column of the pixel sections for outputting the signal charge and the reset level from the corresponding column of the pixel sections selected by the row selection line, wherein a resistance per unit area of the row selection line is higher than that of the signal reset line and the row selection line and the signal reset line are stacked sandwiching therebetween a dielectric film.

8. The MOS type image sensor as defined in claim 7, wherein the row selection line is made of a first conductive material containing silicon and the signal reset line is made of a second conductive material containing aluminum.

9. The MOS type image sensor as defined in claim 7, wherein the width of the row selection line is smaller than that of the signal reset line.

10. The MOS type image sensor as defined in claim 7, wherein a conductive material of the signal reset line and the row selection line is substantially the same as that of a gate electrode of a transistor included in the image sensor.

11. The MOS type image sensor as defined in claim 1, further comprising a photodiode and an amplifier in the pixel sections.

12. The MOS type image sensor as defined in claim 7, further rising a photodiode and an amplifier in the pixel sections.

\* \* \* \* \*